US011456028B2

(12) United States Patent
Sakui et al.

(10) Patent No.: US 11,456,028 B2
(45) Date of Patent: Sep. 27, 2022

(54) SEMICONDUCTOR DEVICE AND CONTROL METHOD THEREOF

(71) Applicants: HONDA MOTOR CO., LTD., Tokyo (JP); TOKYO INSTITUTE OF TECHNOLOGY, Tokyo (JP)

(72) Inventors: Koji Sakui, Wako (JP); Takayuki Ohba, Tokyo (JP)

(73) Assignees: HONDA MOTOR CO., LTD., Tokyo (JP); TOKYO INSTITUTE OF TECHNOLOGY, Tokyo (JP)

(*) Notice: Subject to any disclaimer, the term of this patent is extended or adjusted under 35 U.S.C. 154(b) by 0 days.

(21) Appl. No.: 17/191,752

(22) Filed: Mar. 4, 2021

(65) Prior Publication Data

US 2021/0280234 A1 Sep. 9, 2021

(30) Foreign Application Priority Data

Mar. 6, 2020 (JP) .............................. JP2020-038815

(51) Int. Cl.
  *G11C 11/408* (2006.01)
  *G11C 11/4096* (2006.01)
  *H01L 23/48* (2006.01)
  *H01L 25/18* (2006.01)

(52) U.S. Cl.
  CPC ...... *G11C 11/4087* (2013.01); *G11C 11/4096* (2013.01); *H01L 23/481* (2013.01); *H01L 25/18* (2013.01)

(58) Field of Classification Search
  CPC ............ G11C 11/4087; G11C 11/4096; G11C 29/4401; G11C 5/025; G11C 29/76; H01L 23/481; H01L 25/18

USPC ........................................ 365/189.05, 230.03
See application file for complete search history.

(56) References Cited

U.S. PATENT DOCUMENTS

| 4,636,986 A | * | 1/1987 | Pinkham | .............. G11C 7/1075 365/240 |
| 4,683,555 A | * | 7/1987 | Pinkham | .............. G11C 7/1075 345/545 |
| 4,739,414 A | * | 4/1988 | Pryor | ....................... H04N 1/04 358/496 |

(Continued)

FOREIGN PATENT DOCUMENTS

| JP | 2006-277870 | 10/2006 |
| JP | 2018-032141 | 3/2018 |

*Primary Examiner* — Michael T Tran

(74) *Attorney, Agent, or Firm* — Amin, Turocy & Watson, LLP

(57) ABSTRACT

A semiconductor device according to the present invention is formed by a plurality of semiconductor chips laminated on a substrate which are connected via a through electrode penetrating in a lamination direction, in which the plurality of semiconductor chips include first semiconductor chips 104 each having memory blocks and a decoder and a second semiconductor chip having a logic circuit, the logic circuit includes one selection circuit connected to the decoder of all the first semiconductor chips 104 and configured to select addresses of a first memory block 106A that stops input/output and a second memory block 106B that performs input/output instead among the plurality of memory blocks, and the addresses of the selected first memory block 106A and the selected second memory block 106B are each common to all the first semiconductor chips.

5 Claims, 4 Drawing Sheets

(56) References Cited

U.S. PATENT DOCUMENTS

| | | | | |
|---|---|---|---|---|
| 5,680,581 A * | 10/1997 | Banno | ............... | G06F 12/1441 |
| | | | | 711/163 |
| 6,144,592 A * | 11/2000 | Kanda | ............... | G11C 29/785 |
| | | | | 365/201 |
| 7,495,977 B1 * | 2/2009 | Moscaluk | ............ | G11C 29/72 |
| | | | | 365/201 |
| 2003/0217200 A1 * | 11/2003 | Yoshioka | ............ | G06F 12/1425 |
| | | | | 711/E12.099 |
| 2006/0256629 A1 * | 11/2006 | Roohparvar | ......... | G11C 29/808 |
| | | | | 365/200 |
| 2007/0147144 A1 * | 6/2007 | Tokiwa | ............... | G11C 29/76 |
| | | | | 365/185.09 |
| 2008/0028260 A1 * | 1/2008 | Oyagi | ............... | G11C 29/808 |
| | | | | 714/E11.054 |
| 2008/0043557 A1 * | 2/2008 | Ko | ............... | G11C 17/18 |
| | | | | 365/225.7 |
| 2008/0062761 A1 * | 3/2008 | Tu | ............... | G11C 29/76 |
| | | | | 365/185.09 |
| 2008/0198646 A1 * | 8/2008 | Park | ............... | G11C 29/808 |
| | | | | 365/225.7 |
| 2008/0298126 A1 * | 12/2008 | Ohta | ............... | G11C 29/76 |
| | | | | 365/185.09 |
| 2009/0010057 A1 * | 1/2009 | Tsuji | ............... | G11C 16/34 |
| | | | | 365/185.11 |
| 2009/0040827 A1 * | 2/2009 | Kim | ............... | G11C 29/76 |
| | | | | 365/185.11 |
| 2009/0055621 A1 * | 2/2009 | Nakanishi | ............ | G11C 29/808 |
| | | | | 711/E12.001 |
| 2009/0083478 A1 * | 3/2009 | Kunimatsu | ......... | G06F 12/0804 |
| | | | | 711/E12.001 |
| 2009/0303815 A1 * | 12/2009 | Yu | ............... | G11C 29/44 |
| | | | | 365/200 |
| 2010/0042880 A1 * | 2/2010 | Sakai | ............... | G11C 29/56008 |
| | | | | 714/719 |
| 2010/0046292 A1 * | 2/2010 | Hahn | ............... | G11C 29/76 |
| | | | | 365/185.11 |

* cited by examiner

SEMICONDUCTOR DEVICE AND CONTROL METHOD THEREOF

BACKGROUND OF THE INVENTION

Field of the Invention

The present invention relates to a semiconductor device and a control method thereof.

Priority is claimed on Japanese Patent Application No. 2020-038815, filed in Japan on Mar. 6, 2020, the content of which is incorporated herein by reference.

Description of Related Art

In recent years, a high bandwidth memory (HBM), in which DRAM chips are laminated to expand a bandwidth and increase a speed, has attracted attention (Patent Documents 1 and 2). The most advanced HBM2 currently being developed is made by laminating four chips and has input/output I/Os for 1024 channels. In order to adapt to the speed of a CPU/GPU whose speed is further increased, in HBMs to be developed in the future, the number of input/output I/Os needs to be increased by one or two digits in some way to realize larger-scale parallel processing (parallelism).

In order to realize large-scale parallel processing in which the number of input/output I/Os is increased by one or two digits, it is necessary to reduce the size of a through electrode (TSV) and narrow the pitch from a current 100 μm pitch to a pitch of tens of micrometers, and finally to a 10 μm pitch. However, since the thickness of a DRAM chip to be laminated is about 50 μm and a laminated chip pitch is about 100 μm, reduction in size and pitch of the TSV are hindered due to the design rule, and thus there are constraints on increasing the number of inputs/outputs (I/O) connected to a TSV.

Patent Documents

[Patent Document 1] Japanese Unexamined Patent Application, First Publication No. 2018-32141
[Patent Document 2] Japanese Unexamined Patent Application, First Publication No. 2006-277870

SUMMARY OF THE INVENTION

When a semiconductor chip has a defective memory block, it is controlled such that input/output of the defective memory block is stopped and input/output of a redundant memory block is alternatively performed. Since a distribution of defective memory blocks may differ for each semiconductor chip, replacement of the defective memory block with the redundant memory block is performed in units of semiconductor chips. Since an address of the memory block to be replaced differs for each semiconductor chip, it is necessary to provide a selection circuit for selecting a memory block performing input/output for each semiconductor chip. When a plurality of selection circuits are provided, the semiconductor device increases in size, the circuit configuration becomes complicated, variation occurs in speed of input/output to/from the memory block, and delay is likely to occur.

The present invention has been made in view of the above circumstances, and an objective thereof is to provide a semiconductor device and a control method thereof in which a configuration of a circuit to be used in accordance with replacement of a memory block performing input/output is simplified.

In order to solve the above-described problems, the present invention employs the following methods.

(1) A semiconductor according to one aspect of the present invention is a semiconductor device in which a plurality of semiconductor chips laminated on a substrate are electrically connected via a plurality of through electrodes penetrating in a lamination direction, in which the plurality of semiconductor chips include first semiconductor chips each having one or more memory blocks and a decoder and a second semiconductor chip having a logic circuit that controls operations of the memory blocks, the logic circuit includes one selection circuit connected to the decoder of all the first semiconductor chips and configured to select addresses of a first memory block that stops input/output and a second memory block that performs input/output instead among the plurality of memory blocks, and the addresses of the selected first memory block and the selected second memory block are each common to all the first semiconductor chips.

(2) In the semiconductor device according to (1) described above, the plurality of semiconductor chips may be joined to each other without a bump interposed.

(3) In the semiconductor device according to (1) or (2) described above, between an X direction and a Y direction perpendicular to each other on the first semiconductor chip, the selection circuit may include a first selection circuit that selects the address in the X direction and a second selection circuit that selects the address in the Y direction.

(4) In the semiconductor device according to any one of (1) to (3) described above, the addresses of the first memory block and the second memory block to be selected may be common in either the X direction or the Y direction.

(5) A control method of a semiconductor device according to one aspect of the present invention is a control method of the semiconductor device according to any one of (1) to (4) described above and includes configuring the selection circuit to stop input/output of the first memory block and to perform input/output of the second memory block instead in each of the first semiconductor chips, and causing addresses of the selected first memory blocks and addresses of the selected second memory blocks to each be made common in all the first semiconductor chips.

According to the semiconductor device and the control method of the present invention, the memory block in which a defect has occurred and all the memory blocks in the lamination direction of the first semiconductor chips overlapping the defective memory block are replaced together, and thereby the addresses of the memory blocks to be replaced are made common between the semiconductor chips. Therefore, the number of circuits for selecting the address of the memory block to be replaced in accordance with replacement of the memory block performing input/output can be reduced to one, and thus a configuration of the circuit to be used can be simplified.

DETAILED DESCRIPTION OF THE INVENTION

Figure 1:
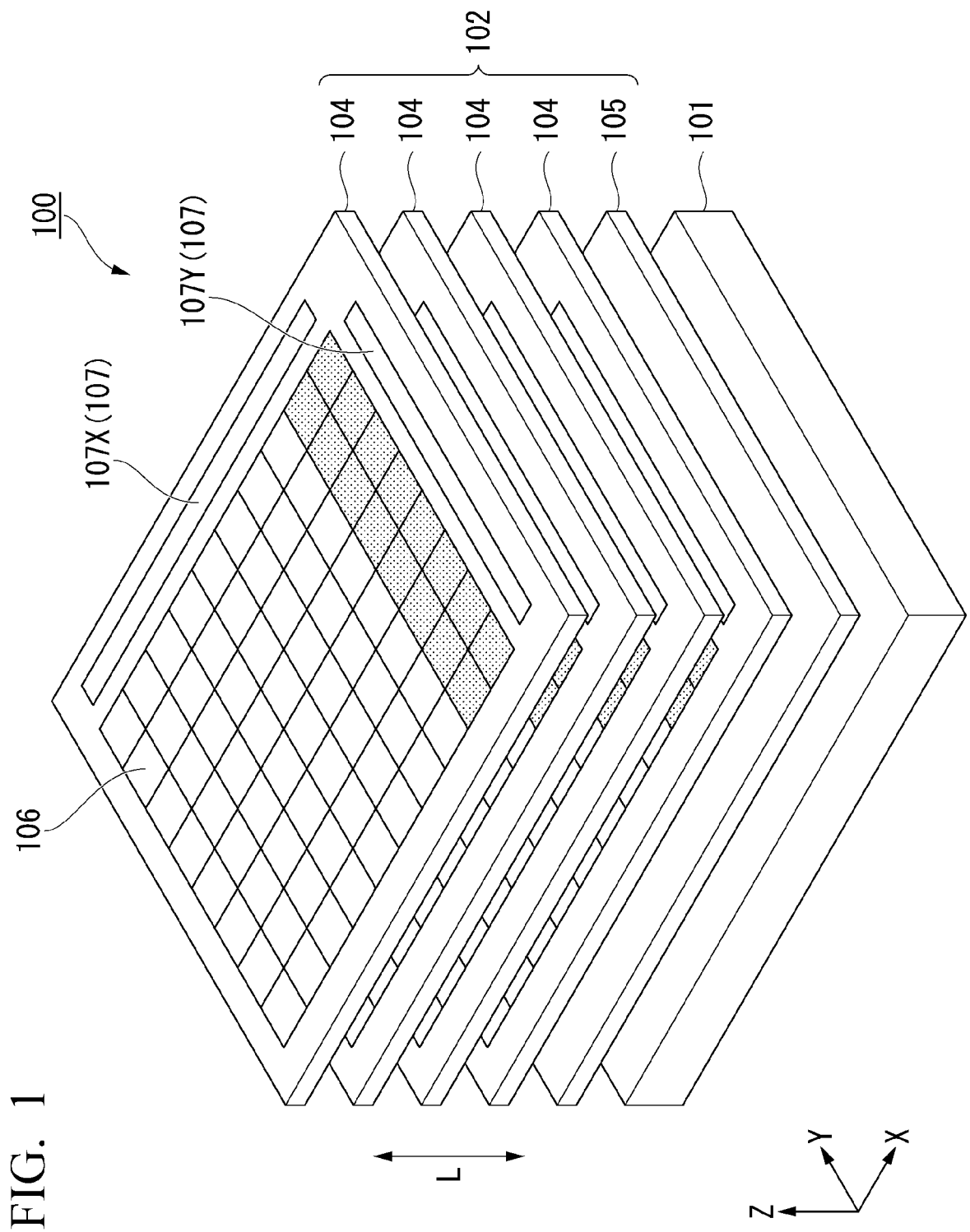
FIG. 1 is a perspective view of a semiconductor device according to a first embodiment of the present invention.

Hereinafter, a semiconductor device and a control method thereof according to an embodiment to which the present invention is applied will be described in detail with reference to the drawings. In the drawings used in the following description, there are cases in which characteristic portions are appropriately enlarged for convenience of illustration so that characteristics of the present invention can be easily understood, and dimensional proportions and the like between respective constituent elements may not be the same as the actual ones. Also, materials, dimensions, and the like illustrated in the following description are merely examples, and the present invention is not limited thereto and can be implemented with appropriate modifications within a range not changing the gist of the present invention.

Figure 2:
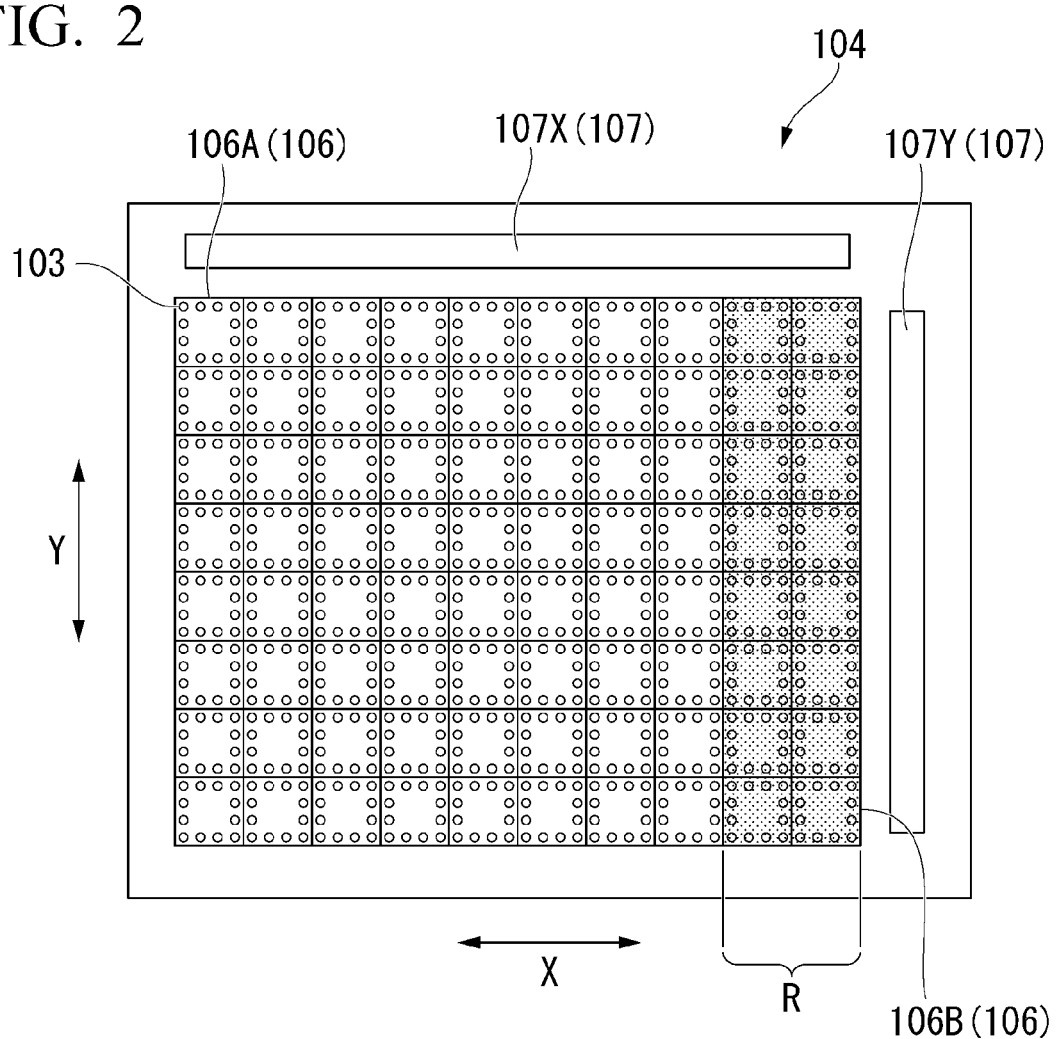
FIG. 2 is a plan view of a first semiconductor chip constituting the semiconductor device of FIG. 1.
Figure 3:
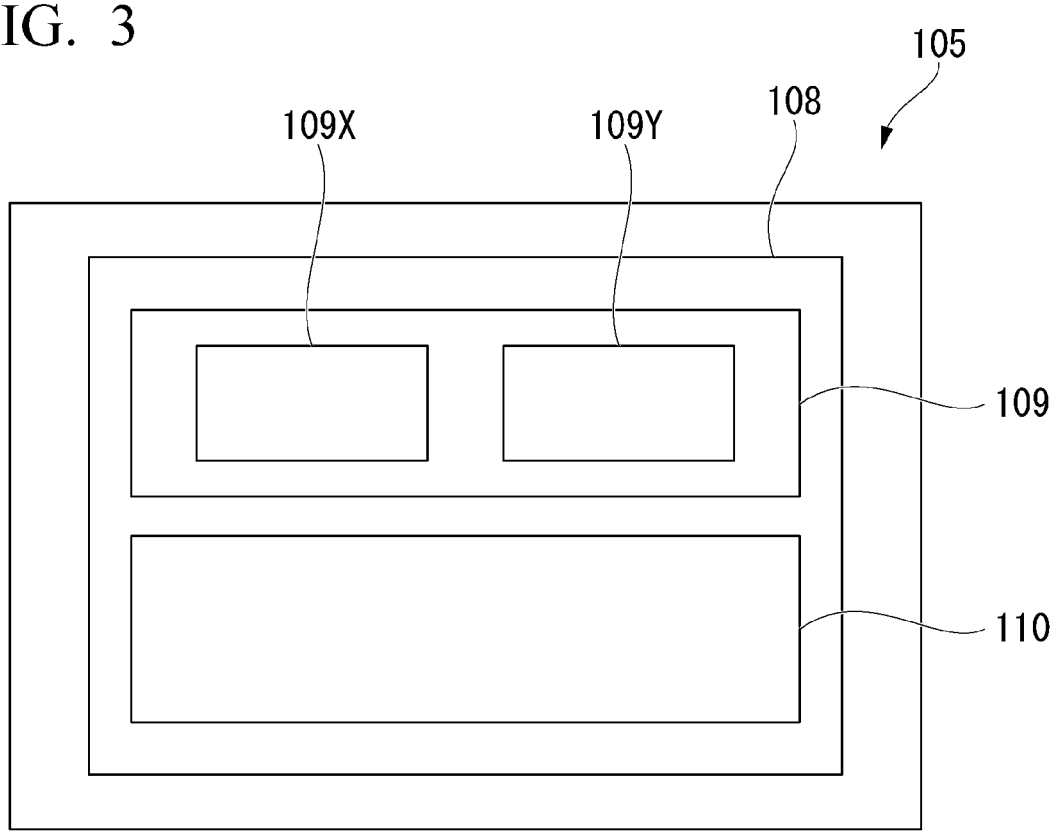
FIG. 3 is a plan view of a second semiconductor chip constituting the semiconductor device of FIG. 1.
Figure 4:
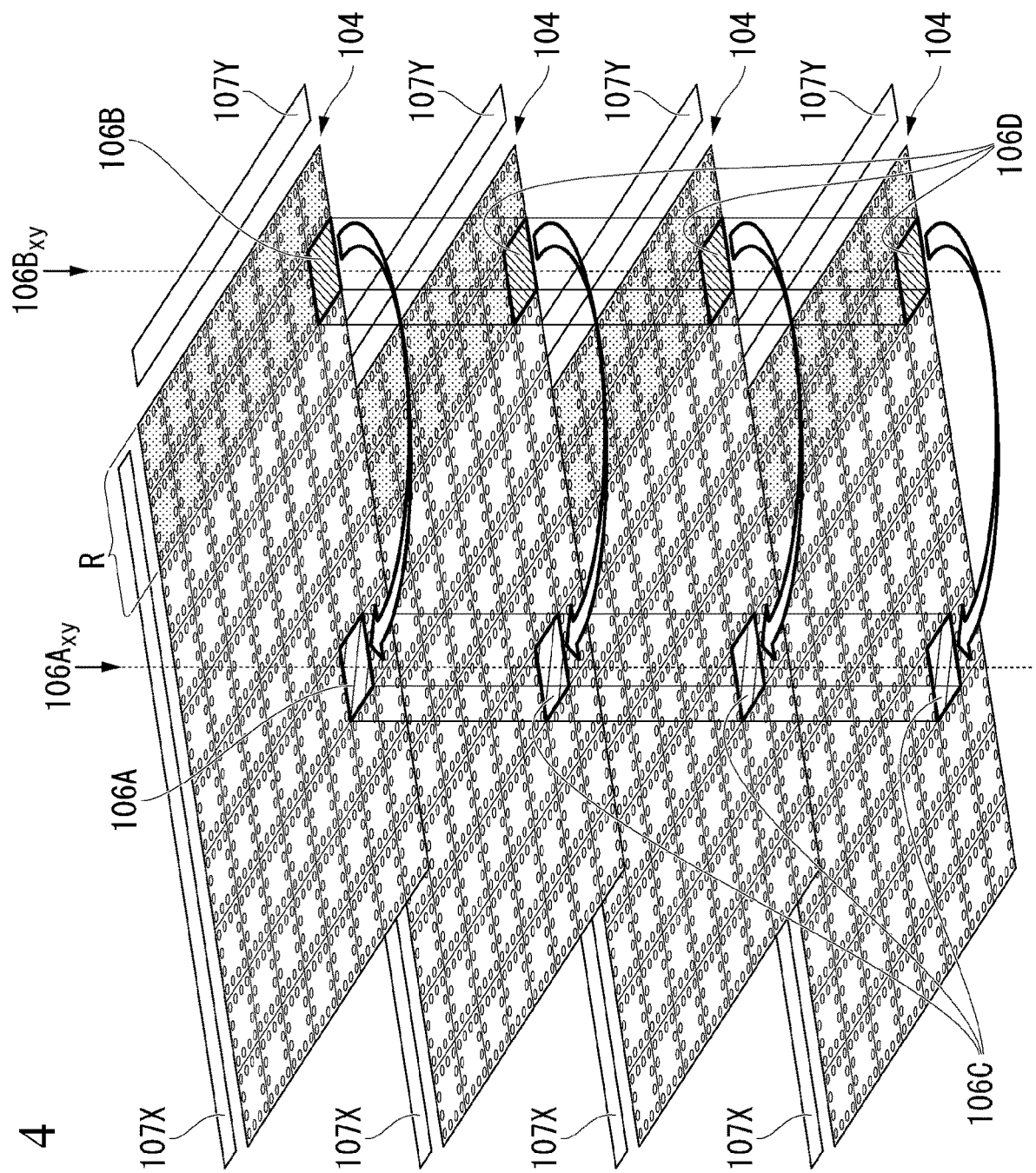
FIG. 4 is a perspective view of memory blocks constituting each semiconductor chip of FIG. 1.

FIG. 1 is a perspective view schematically illustrating a configuration example of a semiconductor device 100 according to a first embodiment of the present invention. FIG. 2 is a plan view of a first semiconductor chip 104 constituting the semiconductor device 100. FIG. 3 is a plan view of a second semiconductor chip 105 constituting the semiconductor device 100. FIG. 4 is a perspective view of memory blocks (sub-memory arrays, tiles) 106 constituting the first semiconductor chip 104.

The semiconductor device 100 mainly includes a substrate 101, a plurality of semiconductor chips 102 laminated on the substrate 101, and a through electrode (TSV) 103 penetrating the plurality of semiconductor chips 102 in a lamination direction L and having one end fixed to the substrate 101.

The plurality of semiconductor chips 102 include one or more first semiconductor chips 104 and the second semiconductor chip 105 and are electrically connected to each other via the through electrode 103. The first semiconductor chips 104 each include one or more memory blocks 106 and a decoder 107. The second semiconductor chip 105 includes a logic circuit 108 that controls operations of the memory blocks 106. Here, a case in which one second semiconductor chip 105 and four first semiconductor chips 104 are formed on the substrate 101 is exemplified.

A state in which the plurality of semiconductor chips 102 are separated from each other is illustrated in FIG. 1, but they are actually joined to each other. However, when the semiconductor chips 102 are joined to each other with bumps interposed therebetween, a stress applied to the semiconductor chip increases due to a difference in thermal expansion coefficient between materials of the bump and the semiconductor chip. Further, since a distance between the semiconductor chips 102 increases by the size of the bump, the length of the through electrode 103 needs to be increased. Also, from the perspective of an aspect ratio, the through electrode 103 needs to be thickened by an amount of the increased length, and furthermore, a pitch between the through electrodes 103 needs to be increased.

When these points are considered, the semiconductor chips 102 are preferably joined directly or with an intermediate layer (adhesive layer or the like) sandwiched therebetween without interposing the bumps in terms of realizing reduction in size and pitch of the through electrode 103. When the semiconductor chips 102 are joined without the bumps interposed therebetween, a distance between the through electrodes 103 of adjacent memory blocks 106 can be reduced without considering contact between the bumps. Therefore, the through electrode 103 can be provided at a position very close to an end portion of an outer circumferential portion (hereinafter simply referred to as an outer circumference) of the memory block 106.

As a thickness of the semiconductor chip 102 becomes smaller, it becomes easier to realize reduction in size and pitch of the through electrode 103. When it is assumed that the through electrodes 103 are formed at a pitch of tens of micrometers, a thickness of the semiconductor chip 102 is preferably 10 µm or less, and more preferably 5 µm or less. However, when the thickness of the semiconductor chip 102 is made too small, the semiconductor chip 102 breaks easily when stress is applied due to it being joined with another semiconductor chip 102 or the like. In consideration of preventing breakage, the thickness of the semiconductor chip 102 is preferably 2 µm or more.

The first semiconductor chip 104 includes at least one, preferably more than one, and more preferably a two-digit number of memory blocks 106 such as a DRAM on a chip substrate made of a semiconductor material, an insulator material, or the like, and a predetermined functional element such as a DRAM is provided for each memory block 106. In FIG. 1, a case in which the first semiconductor chip 104 includes 64 first memory blocks (8×8=64), 16 second memory blocks (8×2=16), and a total of 80 memory blocks 106 is exemplified. The number of laminations of the first semiconductor chip 104 is not limited.

The first semiconductor chip 104 includes the decoder 107 that specifies an address of the memory block 106 configured to perform input/output. Illustration of an interconnection connecting the decoder 107 and the memory block 106 is omitted. The decoder 107 is connected to each of the plurality of through electrodes 103 to perform input/output operations of signals. Thereby, the functional element (transistor) connected to each of the plurality of through electrodes 103 can be caused to perform an on or off operation at a predetermined timing.

Here, the memory blocks 106 are aligned to form a grid in an X direction and a Y direction perpendicular to each other on each first semiconductor chip 104. A first decoder 107X that functions to perform input/output for the memory blocks 106 at addresses specified in the X direction, and a second decoder 107Y that functions to perform input/output for the memory blocks 106 at addresses specified in the Y direction are provided on each first semiconductor chip 104.

As illustrated in FIG. 3, a logic circuit 108 of the second semiconductor chip 105 includes one selection circuit 109 that selects an address of the memory block on which input/output is controlled, and a peripheral circuit 110 that controls operations of other functional elements.

The selection circuit 109 is connected to the decoders 107 of all the first semiconductor chips 104. Also, the selection circuit 109 selects an address 106AXY of a first memory block 106A in which a defect has occurred and input/output is stopped and an address 106BXY of a second memory block (redundant memory block) 106B that performs input/output instead among the plurality of memory blocks 106. The decoder 107 causes the first memory block 106A selected by the selection circuit 109 to perform an off operation and causes the second memory block 106B selected in the same way to perform an on operation. In this way, the memory block in which input/output is performed can be replaced by replacing the defective first memory block 106A with the normal second memory block 106B.

Here, a case in which the second memory blocks 106B are collectively disposed in an end region R is exemplified, but a disposition of the second memory blocks 106B is preferably performed so that a configuration of the peripheral circuit is simplified according to a distribution of occurrence of defects. The number of second memory blocks 106B is determined in consideration of a yield.

Here, a first selection circuit 109X that performs selection of an address in the X direction via the first decoder 107X, and a second selection circuit 109Y that performs selection of an address in the Y direction via the second decoder 107Y are provided to correspond to a configuration of the decoder 107.

The selection circuit 109 also selects first memory blocks 106C of other semiconductor chips 102 that overlap the first memory block 106A in the lamination direction L (Z direction) as memory blocks that stop inputs/outputs like the first memory block 106A. Also, the selection circuit 109 also selects memory blocks 106D of other semiconductor chips 102 that overlap the second memory block 106B in the lamination direction L as memory blocks whose inputs/outputs are performed like the second memory block 106B. Further, presence or absence of a defect does not matter for the first memory blocks 106C selected from other semiconductor chips 102 that overlap the first memory block 106A in the lamination direction L.

When addresses of the first memory blocks and the second memory blocks to be selected (replaced) are different from each other between the semiconductor chips 102, an independent selection circuit semiconductor device 102 needs to be provided for each semiconductor chip 102. That is, the selection circuits 109 equal in number to the semiconductor chips 102 are required. On the other hand, in the present embodiment, the addresses of the first memory block 106A and the second memory block 106B selected by the selection circuit 109 are common to all the semiconductor chips 102. Therefore, in the present embodiment, selection of the memory blocks of all the semiconductor chips can be collectively performed with one selection circuit 109.

A control method of the semiconductor device 100 of the present embodiment can be implemented by configuring one selection circuit 109 common to all the first semiconductor chips 104 to stop input/output of the first memory block in each of the first semiconductor chips 104 and perform input/output of the second memory block instead. At this time, addresses of the selected first memory blocks 106A and addresses of the selected second memory blocks 106B are each made common (aligned) in all the first semiconductor chips 104.

The addresses of the first memory block 106A or 106C and the second memory block 106B or 106D which are to be replaced with each other may be common in either the X direction or the Y direction. For example, when the addresses of the first memory block 106A and the second memory block 106B in the Y direction are common (the same), since a signal sent to the decoder 107Y before and after the replacement does not need to be changed, occurrence of delay due to the change can be suppressed.

As described above, in the semiconductor device 100 according to the present embodiment, the memory block in which a defect has occurred and all the memory blocks in the lamination direction of the first semiconductor chips 104 overlapping the defective memory block are replaced together, and thereby the addresses of the memory blocks to be replaced are made common between the first semiconductor chips 104. Therefore, the number of circuits for selecting addresses of the memory blocks to be replaced can be reduced to one, a configuration of the peripheral circuits for the first semiconductor chips 104 and the second semiconductor chip 105 is simplified, and thus the downsized semiconductor device 100 can be realized. Further, a problem of delay in operation due to provision of a plurality of selection circuits 109 can be avoided. Although memory blocks that have not been defective may also be replaced, the number is negligible with respect to the entire number of memory blocks.

EXPLANATION OF REFERENCES

100 Semiconductor device
101 Substrate
102 Semiconductor chip
103 Through electrode
104 First semiconductor chip
105 Second semiconductor chip
106 Memory block
106A, 106C First memory block
106B, 106D Second memory block
107 Decoder
108 Logic circuit
109 Selection circuit

What is claimed is:

1. A semiconductor device in which a plurality of semiconductor chips laminated on a substrate are electrically connected via a plurality of through electrodes penetrating in a lamination direction, wherein
the plurality of semiconductor chips include first semiconductor chips each having one or more memory blocks and a decoder and a second semiconductor chip having a logic circuit that controls operations of the memory blocks,
the memory blocks includes a plurality of first memory blocks and a plurality of second memory blocks,
the logic circuit includes one selection circuit connected to the decoder of all the first semiconductor chips and configured to select addresses of a substituted first memory block among the first memory blocks and a substituting second memory block among the first memory blocks, inputting and outputting of the substituted first memory block being turned off, and inputting and outputting of the substituting second memory block being turned on instead of the substituted first memory block, and
the addresses of the substituted first memory block and the substituting second memory block are each common to all the first semiconductor chips.

2. The semiconductor device according to claim 1, wherein the plurality of semiconductor chips are joined to each other without a bump interposed.

3. The semiconductor device according to claim 1, wherein, between an X direction and a Y direction perpendicular to each other on the first semiconductor chip, the selection circuit includes a first selection circuit that selects the address in the X direction and a second selection circuit that selects the address in the Y direction.

4. The semiconductor device according to claim 1, wherein the addresses of the first memory block and the second memory block to be selected are common in either the X direction or the Y direction.

5. A control method of a semiconductor device, which is a control method of the semiconductor device according to claim 1, comprising:
- configuring the selection circuit to stop input/output of the first memory block and perform input/output of the second memory block instead in each of the first semiconductor chips; and
- causing addresses of the selected first memory blocks and addresses of the selected second memory blocks to each be made common in all the first semiconductor chips.

* * * * *